US008585115B2

(12) United States Patent
Fairhurst et al.

(10) Patent No.: US 8,585,115 B2
(45) Date of Patent: Nov. 19, 2013

(54) METHOD AND APPARATUS FOR LIFTING A HORIZONTALLY-ORIENTED SUBSTRATE FROM A CASSETTE

(75) Inventors: John Robert Fairhurst, Plaistow, NH (US); Jeffrey E. Krampert, Topsfield, MA (US); Richard J. Hertel, Boxford, MA (US); Richard Muka, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/268,129

(22) Filed: Oct. 7, 2011

(65) Prior Publication Data

US 2013/0088028 A1 Apr. 11, 2013

(51) Int. Cl.
*B66F 19/00* (2006.01)
(52) U.S. Cl.
USPC ............................................ 294/213; 414/936
(58) Field of Classification Search
USPC ............. 294/213, 902, 93; 414/796.6, 796.9, 414/217, 217.1, 936; 369/92.1, 30.43, 369/30.55, 30.7, 30.85; 720/601, 603, 614, 720/615; 211/40, 41.12, 41.18; 206/308.1, 206/310, 307.1, 820
See application file for complete search history.

(56) References Cited

U.S. PATENT DOCUMENTS

| 5,106,260 | A | * | 4/1992 | Obrecht | 414/796.6 |
|---|---|---|---|---|---|
| 5,533,614 | A | * | 7/1996 | Walker | 206/308.1 |
| 5,611,426 | A | * | 3/1997 | Warfield | 206/308.1 |
| 5,669,644 | A | * | 9/1997 | Kaihotsu et al. | 294/213 |
| D421,870 | S | * | 3/2000 | Boucard | D6/627 |
| 6,052,352 | A | * | 4/2000 | Liou | 720/603 |
| D430,424 | S | * | 9/2000 | Belden et al. | D6/407 |
| 6,368,049 | B1 | * | 4/2002 | Osaka et al. | 414/783 |
| 6,517,130 | B1 | * | 2/2003 | Donoso et al. | 294/185 |
| 6,760,052 | B2 | * | 7/2004 | Cummins et al. | 347/171 |
| 7,104,578 | B2 | * | 9/2006 | Hartog | 294/183 |
| 7,789,442 | B2 | * | 9/2010 | Arai | 294/93 |

* cited by examiner

Primary Examiner — Stephen Vu

(57) ABSTRACT

A system and method are disclosed for removing horizontally oriented substrates from a cassette. A substrate lifter has an engagement end for engaging a substrate and an adjustment end for engaging an adjustment assembly. The engagement end includes a recess having first and second arcuate sidewalls configured to engage an OD of the substrate, and a circular protrusion positioned between the first and second arcuate sidewalls. The circular protrusion allows lateral movement of the substrate up to a predetermined amount and prevents lateral movement of the substrate in excess of the predetermined amount. Other embodiments are described and claimed.

17 Claims, 10 Drawing Sheets

METHOD AND APPARATUS FOR LIFTING A HORIZONTALLY-ORIENTED SUBSTRATE FROM A CASSETTE

BACKGROUND OF THE INVENTION

1. Field of the Invention

Embodiments relate to the field of device manufacturing. More particularly, the present disclosure relates to an improved method and apparatus for lifting a horizontally-oriented substrates from a cassette.

2. Discussion of Related Art

Attempts have been made to automate the handling and transfer of thin substrates during ion implantation, sputter coating and other processes both for preventing contamination, abrasion or damage to the substrates and for achieving a high throughput in terms of the number of substrates processed per unit time. Often, substrate cassettes are provided to hold a plurality of discs in vertically facing alignment.

The cassette can be a generally rectangular frame having a pair of parallel side walls which stand facing each other and are grooved so that standard-sized disk-shaped substrates can be held edgewise. The grooves on the side walls of the cassette are vertical and parallel to each other so that the substrate can be moved into and out of the cassette while maintaining its upright vertical position.

An automated substrate transfer system may be used to remove substrates from the cassette. For example, a movable picker can pass through the cassette to engage a substrate and remove it from the cassette. The substrate can then be transferred to processing chamber where one or more deposition, implantation or other treatment processes can be performed. The substrate may remain engaged with the picker throughout the transfer and processing steps, or it may be transferred to a separate carrier for either or both of the transfer and processing steps. Once processing is complete (or a desired processing step is complete), the picker may return the substrate to the cassette or other carrier, where the processed substrates remain while the movable picker removes a next substrate to be processed. This continues until all the substrates have been processed.

A problem with current substrate transfer arrangements is that the picker can contacts the substrate face, which understandably can damage the substrate. Thus, there is a need for an improved system and method for removing substrates from a cassette. The system and method should provide consistent and reliable engagement of a substrate to minimize the chance for damage to occur to the substrate, either through dropping, through contact with of the substrate face, or through engagement with other substrates.

SUMMARY OF THE INVENTION

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

A system and method are disclosed for lifting one or more horizontally oriented substrates out of a cassette without touching the faces of the disk(s) and without the disk faces touching the device.

A substrate lifter is disclosed for removing a horizontally oriented substrate having an inside diameter (ID) and an outside diameter (OD) from a substrate cassette. The substrate lifter comprises an engagement end for engaging the substrate and an adjustment end for engaging an adjustment assembly. The engagement end comprises a recess having first and second arcuate sidewalls configured to engage the OD of the substrate, and a circular protrusion positioned between the first and second arcuate sidewalls. The circular protrusion may allow lateral movement of the substrate up to a predetermined amount and for preventing lateral movement of the substrate in excess of the predetermined amount.

A method is disclosed for removing a horizontally oriented substrate having an ID and an OD from a cassette, the method comprising: positioning a lifter having a recess comprising first and second arcuate sidewalls and a protrusion having a protrusion sidewall adjacent to a cassette containing a plurality of horizontally oriented substrates; engaging the first and second arcuate sidewalls with the OD of a targeted substrate of the plurality of horizontally oriented substrates; capturing the ID of the targeted substrate with the protrusion such that the substrate is allowed to move laterally by a predetermined amount, and prevented from moving laterally by an amount exceeding the predetermined amount; and moving the lifter and the substrate in a first direction until the targeted substrate is removed from the cassette.

A substrate lifter is disclosed for removing a horizontally oriented substrate from a substrate cassette. The substrate lifter comprises an engagement end for engaging the substrate and an adjustment end for engaging an adjustment assembly. The engagement end may include a recess having first and second arcuate sidewalls for engaging an OD of the substrate. The first and second arcuate sidewalls may form a first angle with an upper surface of the lifter such that a radius of the first and second sidewalls is greater adjacent to the upper surface of the lifter than a radius of the first and second sidewalls adjacent to a bottom surface of the recess. A circular protrusion may be provided between the first and second arcuate sidewalls, the circular protrusion for allowing lateral movement of the substrate up to a predetermined amount.

BRIEF DESCRIPTION OF THE DRAWINGS

For a better understanding of the present disclosure, reference is made to the accompanying drawings, which are incorporated herein by reference and in which.

DESCRIPTION OF EMBODIMENTS

Figure 1A:
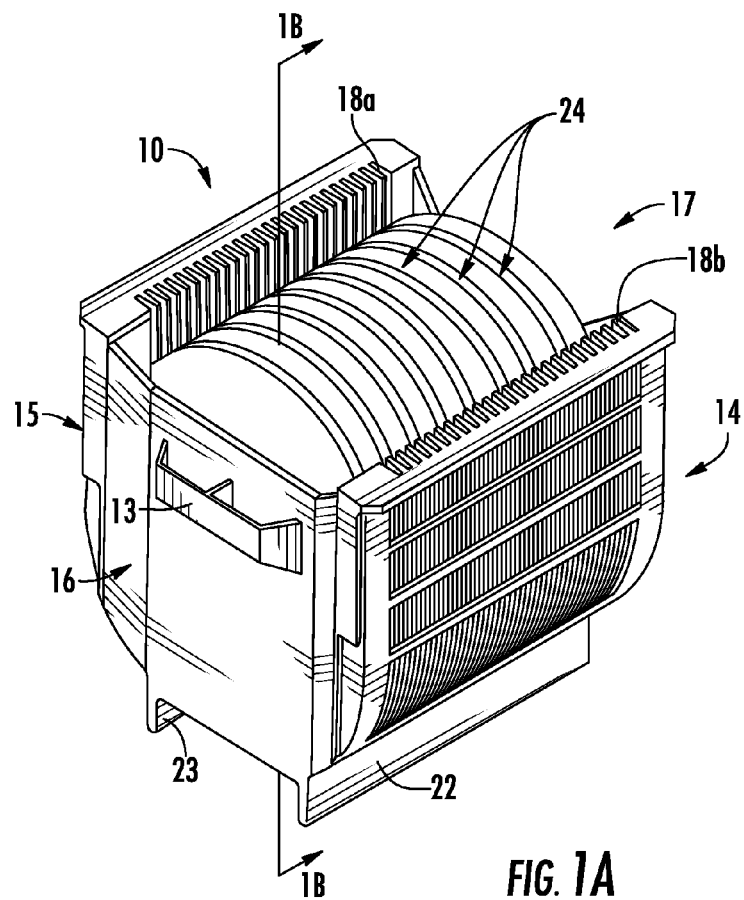
FIGS. 1A and 1B are perspective and cross-section views, respectively, of an exemplary substrate cassette.
Figure 1B:
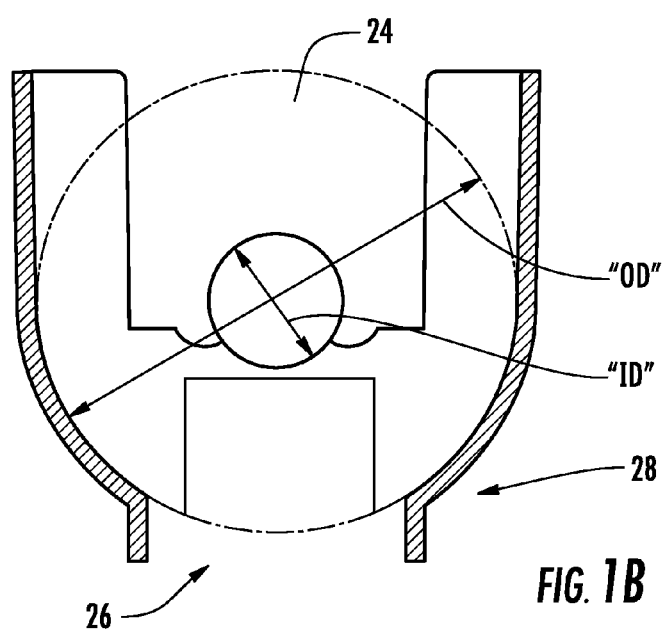

FIGS. 1A and 1B show an exemplary substrate cassette 10 containing a plurality of substrates 24. The cassette 10 may include front and back surfaces 16, 17, first and second sidewalls 14, 15, and pairs of left and right dividers 18a, 18b. The dividers may act as support surfaces to separate and support the substrates. The four walls define an internal bay portion for receiving the substrates and holding them substantially parallel to each other. The substrate cassette can also includes a pair of parallel legs 22, 23 for supporting the cassette 10, and a handle 13 for facilitating handling of the cassette 10. FIG. 1B shows that the cassette 10 has an opening 26 in a rear portion 28 that enables a substrate handling device to engage the individual substrates 24 through the cassette 10. Although the cassette 10 is shown holding the substrates in a vertical orientation, it will be appreciated that the cassette can be rotated so that the substrates are held in a substantially horizontal orientation.

The cassette 10 may function to protect the substrates 24 during transport and storage, but it is not used to hold the substrates 24 during any of the variety of processing steps to which substrates of the kind are often subjected. For example, the substrates 24 may be subject to one or more ion implantation steps or one or more plasma doping steps. Thus, for such processing, the substrates may be transferred to another holding device, an example of which is often referred to as a front opening unified pod, or "FOUP." The FOUP may be part of a substrate handling system that manipulates the individual substrates and subjects the substrates to one or more processing steps.

Figure 2:
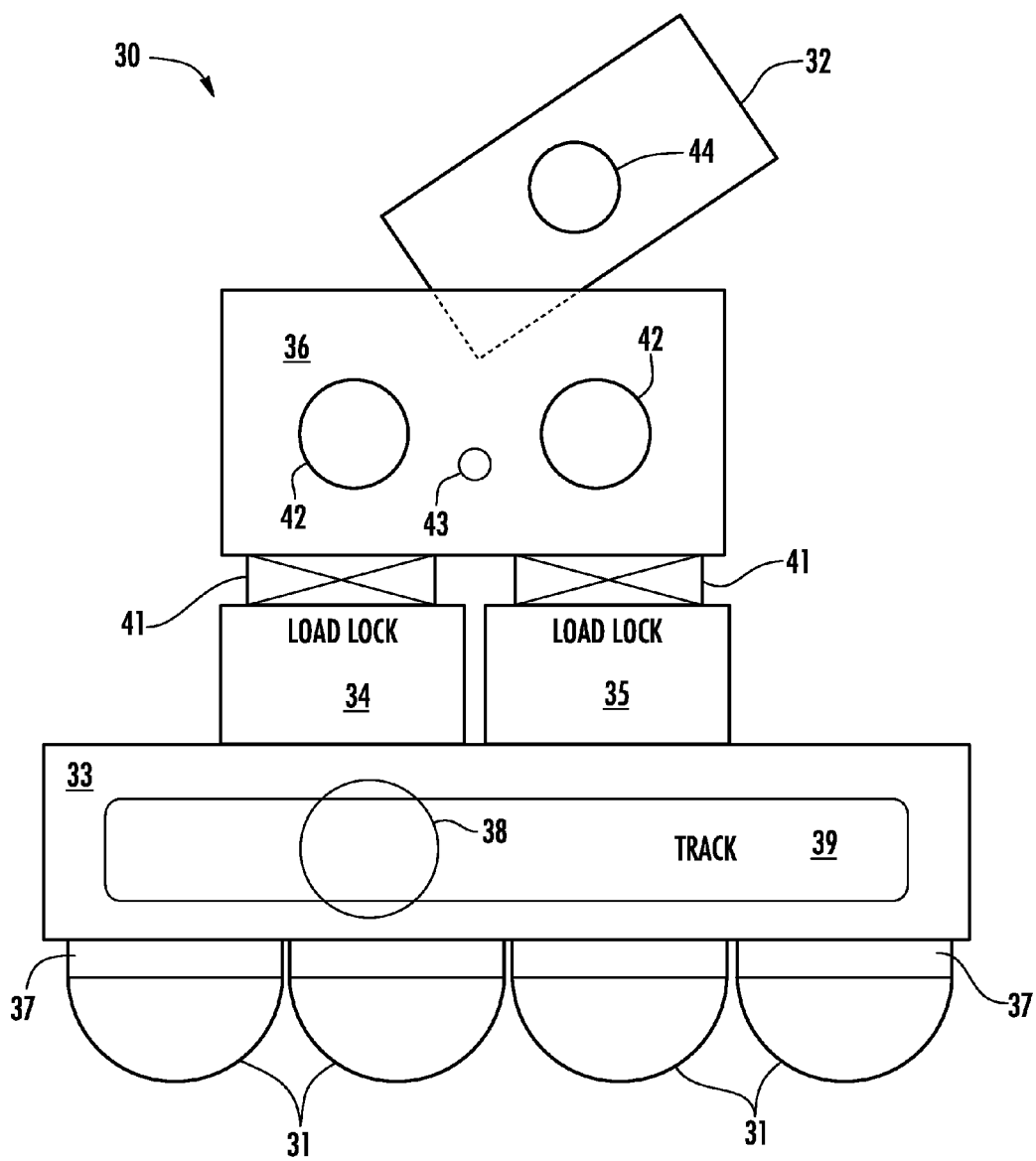
FIG. 2 is a schematic diagram of an exemplary substrate handling system.

FIG. 2 shows an exemplary substrate handling system 30 in which a plurality of FOUPs 31 each hold a plurality of substrates. The substrates are transferred from the FOUPs 31 to a process chamber 32 via a buffer chamber 33, load locks 34 and 35 and a wafer handler chamber 36. Pod doors 37 interface the between the FOUPs 31 and the buffer chamber 33 so that substrates can pass between the FOUPs 31 and buffer chamber 33. In buffer chamber 33, an atmospheric robot 38 transports wafers along a track 39 to move wafers between the FOUPs 31 and load locks 34 and 35. The buffer chamber 33 may be at or near atmospheric pressure, and provides a controlled, low particulate environment. The load locks 34 and 35 communicate with substrate handler chamber 36 through isolation valves 40 and 41, respectively. The substrate handler chamber 36 may include one or more vacuum robots 42 and a substrate alignment station 43. A substrate is transferred by one of the robots 42 from one of the load locks 34, 35 to substrate alignment station 43. The substrate then is transferred to a process station 44 in process chamber 32 for processing, such as by ion implantation. The same process is reversed to transfer the substrate back to one of the FOUPs.

Figure 3:
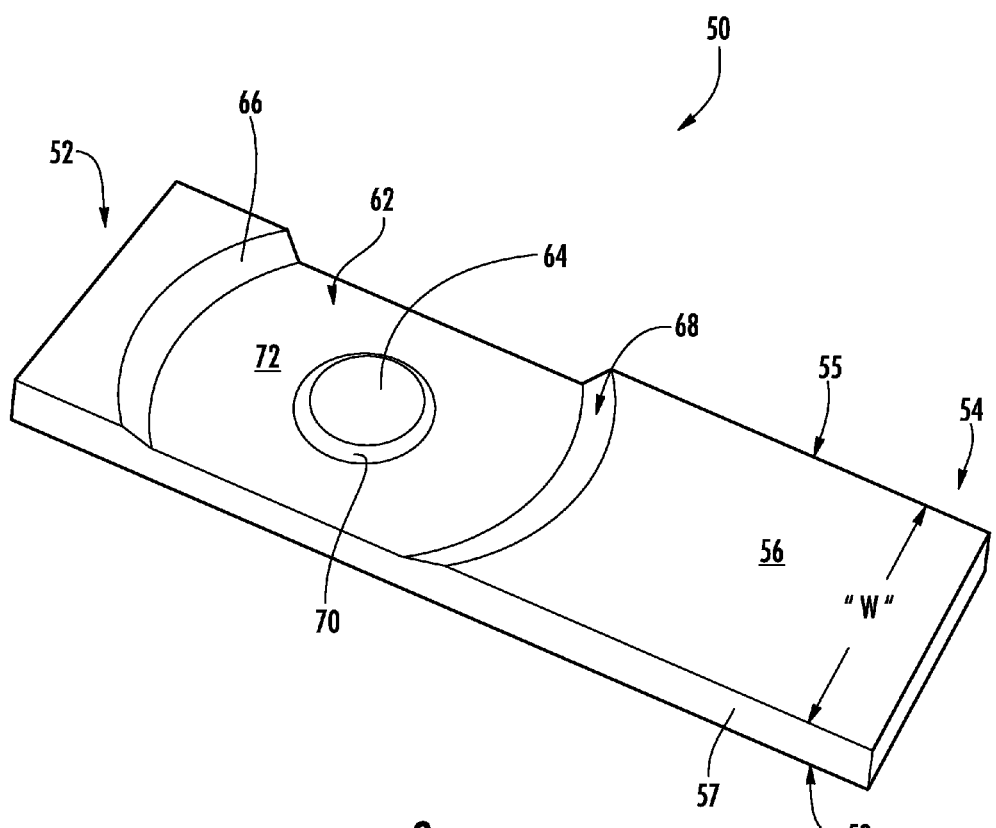
FIG. 3 is a perspective view of an exemplary lifter for use with the cassette and substrate handling system of FIGS. 1A-2.

As will be appreciated, part of the above noted process includes the transfer of substrates from the cassette 10 to the FOUPs 31 (and back to the cassette after processing is complete, as desired). FIG. 3 shows an exemplary substrate lifter 50 for use in removing individual horizontally oriented substrates 24 from a cassette 10. The lifter 50 has first and second ends 52, 54, first and second side walls 55, 57, and generally planar first and second surfaces 56, 58. The first end 52 may be include substrate engaging features while the second end 54 may include features that enable the lifter 50 to be engaged by an adjustment assembly (not shown). The adjustment assembly 60 can be used to manually or automatically move the lifter 50 as desired with respect to the cassette 10 and a substrate 24. In the illustrated embodiment, the substrate engaging features are disposed on the first surface 56.

The substrate engaging features may include a recess 62, and a protrusion 64 positioned within the recess. The recess 62 and protrusion 64 together operate to support and capture a substrate 24 to lift it out and away from the cassette 10 in a desired manner. In one embodiment, the substrate 24 has an outer diameter "OD" and an inner diameter "ID" (see FIG. 1). It will be appreciated that substrates of this type are often used as hard disk drives for computers and other related equipment. The lifter recess 62 may be sized to receive a portion of the substrate 24 therein, with protrusion 64 sized and positioned to fit within the ID of the substrate 24. The recess has first and second arcuate walls 66, 68 that generally correspond to the curvature of the OD of the substrate 24 while the protrusion 64 has a wall 70 that generally corresponds to the curvature of the ID of the substrate 24. Thus arranged, the substrate 24 is received within the lifter recess 62 in the manner shown in FIGS. 4 and 5.

Figure 4:
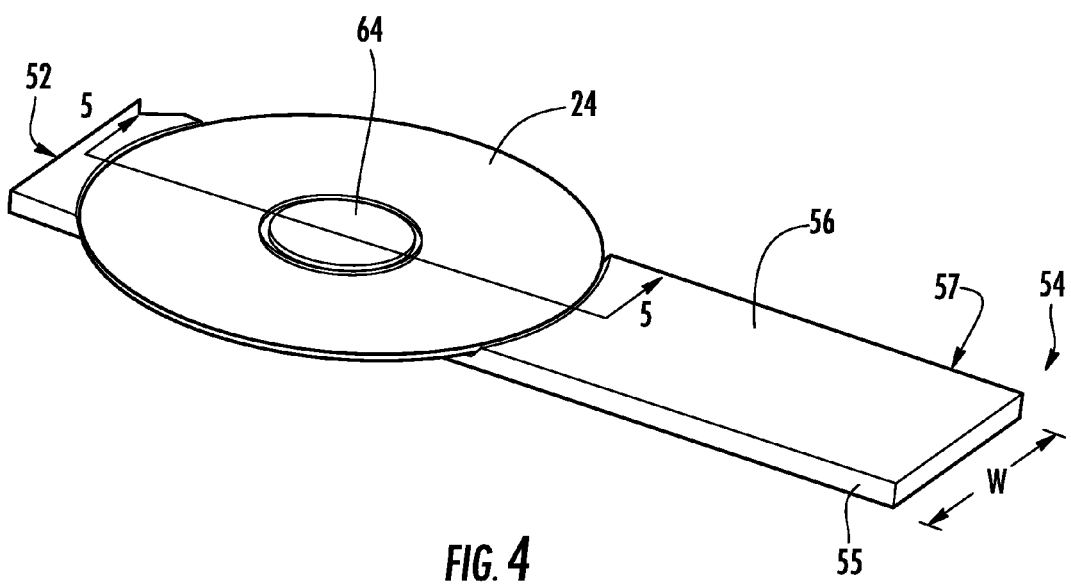
FIG. 4 is a perspective view of the lifter of FIG. 3 engaged with a substrate.

FIG. 4 shows that that a portion of the substrate 24 overlies the first and second side walls 55, 57 of the lifter 50. Thus, in the illustrated embodiment the OD of the substrate 24 is greater than the width "W" of the lifter 50. This arrangement enables the lifter 50 to fit through the relatively narrow opening 26 in the cassette 10 to engage the substrates 24 carried therein. As can be seen in FIG. 1, the opening 26 is substantially smaller than the OD of the substrates 24 carried by the cassette 10.

Figure 5:
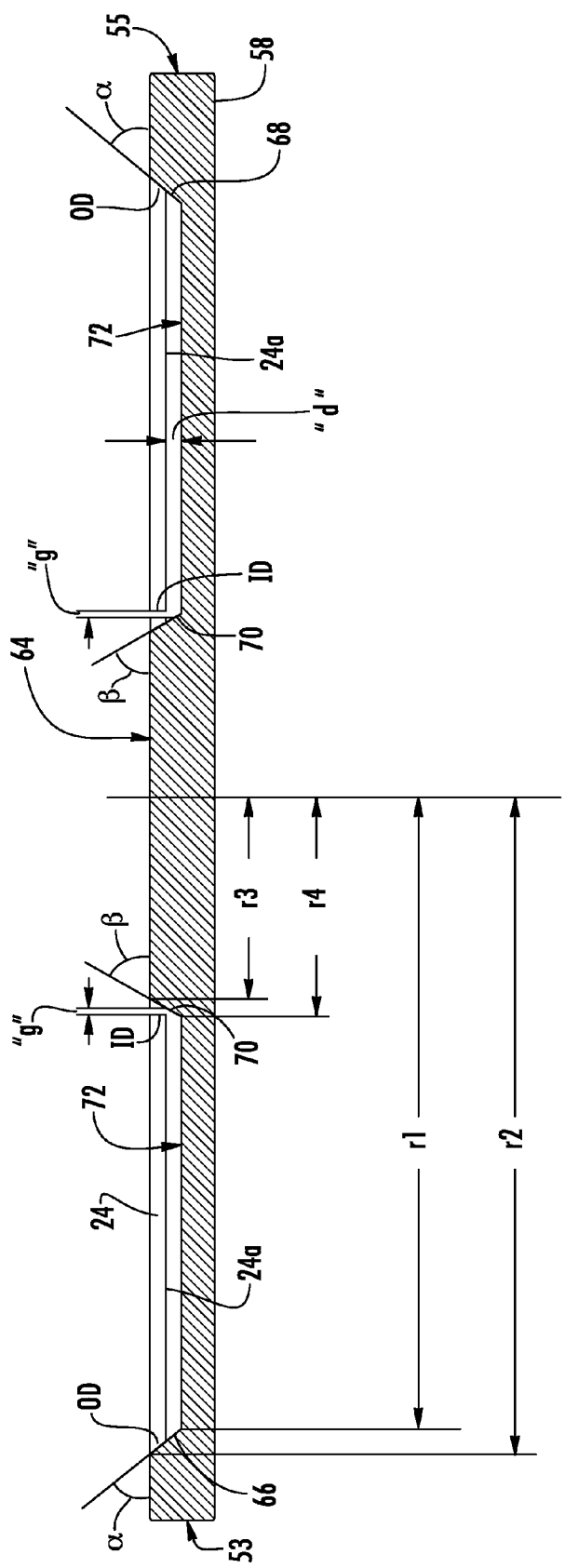
FIG. 5 is a cross-section view of the lifter of FIG. 4 taken along line 5-5 of FIG. 4.

Referring to FIG. 5, the engagement between the lifter 50 and substrate 24 is shown in greater detail. As can be seen, the substrate 24 is held in place by walls 66, 68, 70 of the lifter protrusion and recess. Notably, the disclosed arrangement ensures that the substrate 24 is held above the bottom surface 72 of the recess 62 by a distance "d", thus preventing the substrate face 24a from touching the surface 72. In one embodiment, distance "d" is about 1 millimeter (1 mm). This eliminates the chance that the substrate face may be damaged by the lifter during lifting and carriage operations.

FIG. 5 further shows that the walls 66, 68 of the recess 62 form an angle $\alpha$ with respect to the first surface 56 of the lifter 50, while the protrusion wall 70 forms an angle $\beta$ with respect to the first surface of the lifter 50. The angle $\alpha$ may be about 45 degrees to about 55 degrees, and in an exemplary embodiment, may be about 50 degrees. The angle $\beta$ may be about 60 degrees to about 70 degrees, and in an exemplary embodiment, may be about 65 degrees. As will be appreciated, providing the walls 66, 68, 70 with such an angled configuration enables the lifter 50 to contact the substrate 24 along the edges of the OD and ID, respectively. The angled configuration results in the radius "r1" of the recess 62 measured at the surface 56 of the lifter being greater than the OD of the substrate 24, and the radius "r2" of the recess 62 measured at the bottom surface 72 of the recess being smaller than the OD of the substrate. This ensures that that the OD of the substrate 24 will be held between the recess walls 66, 68, above the bottom surface 72 of the lifter 50. Again, this prevents the substrate face 24a from contacting the bottom surface 72 of the recess during the lifting and carriage process. Likewise, the angled configuration of the protrusion wall 70 results in the radius "r3" of the protrusion 64 measured at the surface 56 of the lifter being smaller than the ID of the substrate 24, and the radius "r4" of the protrusion 64 measured at the bottom surface 72 of the recess being greater than the ID of the substrate.

As noted, during lifting operations (i.e., as the lifter picks the substrate up and moves it out of the cassette 10), the substrate 24 is fully supported by the recess walls 66, 68. Thus, engagement of the substrate OD is all that is required to lift the substrate out and away from the cassette 10. To provide an enhanced degree of assurance that the substrate OD will not slip out of engagement with the recess walls 66 during carriage (e.g., where lifter movement is intentionally or unintentionally interrupted or where the angle of the lifter 50 is changed while moving, protrusion wall 70 is configured to capture the ID of the substrate 24. Specifically, protrusion wall 70 is configured to prevent the substrate from moving laterally (i.e., parallel to the plane of the first surface 56 of the lifter 50), which can prevent the substrate 24 from sliding off the lifter while it is moving.

The values for angles $\alpha$ and $\beta$ may be selected, along with the radii r1, r2, r3 and r4 to ensure that the substrate 24 is offset from the protrusion 64 by a slight amount when the substrate 24 is ideally positioned on the walls 66, 68 of the recess 62. FIG. 5 shows an offset gap "g" between the substrate ID and the protrusion wall 70. In one non-limiting exemplary embodiment, the offset gap "g" is about 0.005 inches.

Figure 6:
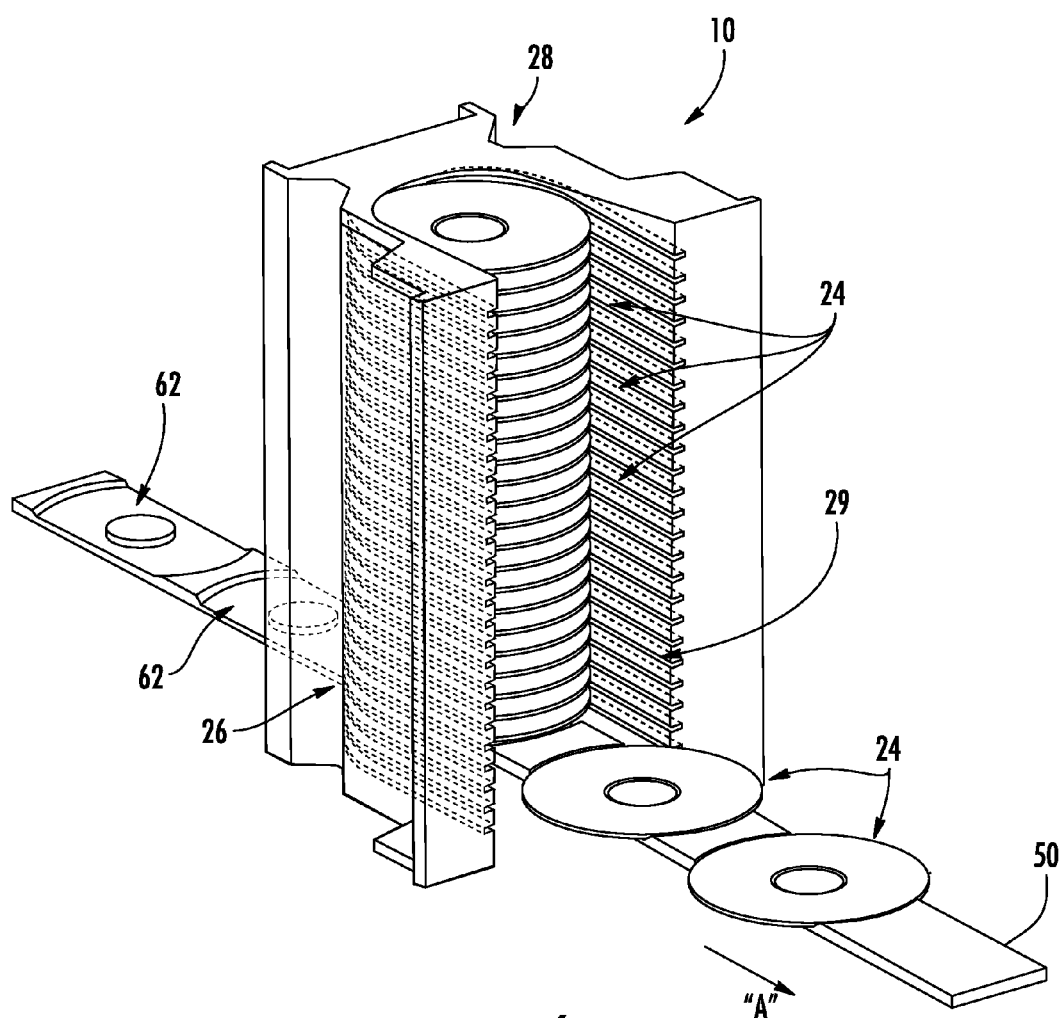
FIG. 6 is an isometric view of the disclosed lifter, an exemplary substrate cassette and a plurality of horizontally oriented substrates.
Figure 7:
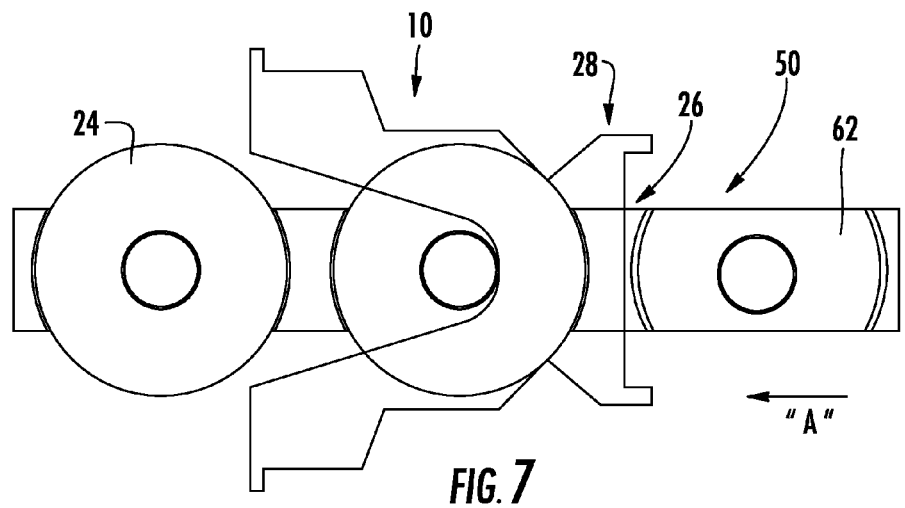
FIG. 7 is a plan view of the lifter, cassette and substrates of FIG. 6.
Figure 8:
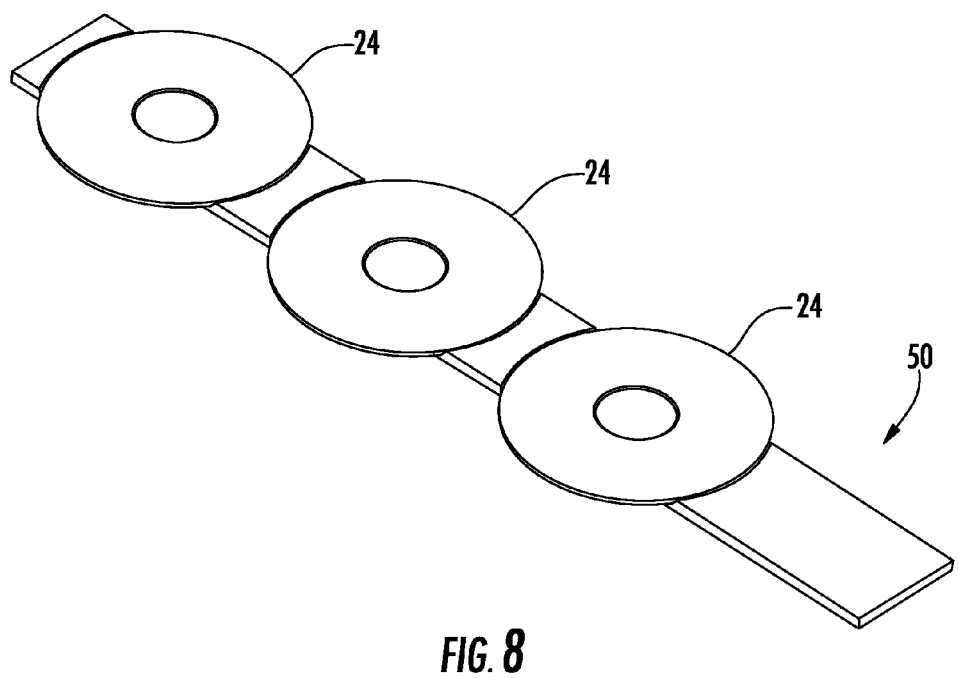
FIG. 8 is an isometric view of an exemplary embodiment of the disclosed lifter engaged with a plurality of substrates.

FIGS. 6 and 7 show the lifter 50 interacting with cassette 10 to remove a plurality of horizontally-oriented substrates 24 from the cassette 10. The lifter 50 may move generally in the direction of arrow "A," entering through the relatively narrow opening 26 in the rear portion 28 of the cassette 10 and exiting with the substrates 24 from the wider front portion 29. As shown, the lifter 50 includes a plurality of recesses 62 for engaging a plurality of substrates 24. Such an arrangement may provide enhanced through-put as compared to a single-recess embodiment. The illustrated lifter 50 includes five recesses 62, though it will be appreciated that greater or fewer recesses could be provided. For example, FIG. 8 shows a three-recess embodiment.

Figure 9A:
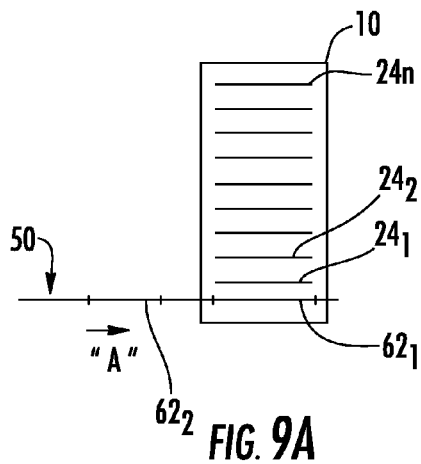
FIG. 9A-9E show a schematic of the movement of the lifter 50 for the embodiment in which the cassette 10 is stationary.
Figure 9B:
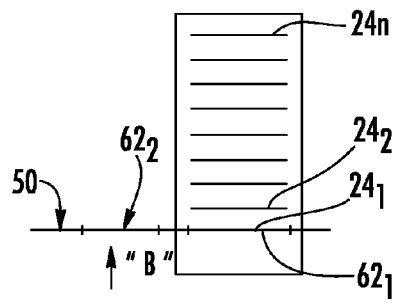
Figure 9C:
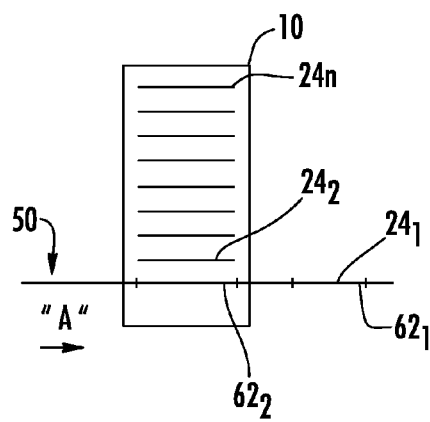
Figure 9D:
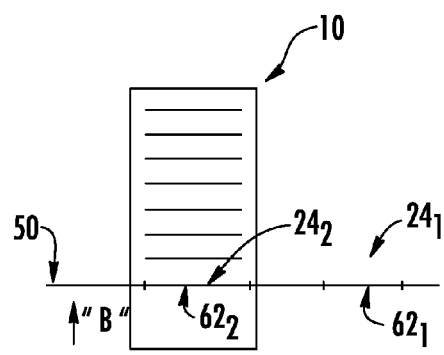
Figure 9E:
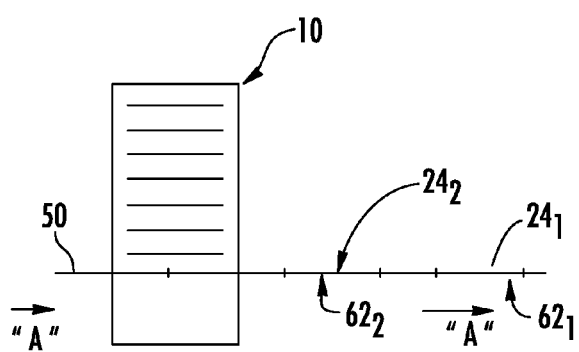

In order to lift the substrates 24 from the cassette 10, relative vertical movement between the lifter 50 and cassette must be provided. In one embodiment, the lifter 50 is vertically movable and the cassette 10 is stationary. Alternatively, the lifter 50 may be vertically stationary and the cassette 10 may be vertically movable. In a further alternative, both the lifter and the cassette may be movable. FIGS. 9A-9E shows a schematic of the movement of the lifter 50 for the embodiment in which the cassette 10 is stationary. In this illustration, the lifter 50 is moved to "pick" (i.e., remove) first and second substrates $24_1$ and $24_2$ from the cassette 10. The first pick occurs when the lifter 50 is moved in the direction of arrow "A" so that a first recess $62_1$ is aligned below a first substrate $24_1$ (FIG. 9A). The lifter is then moved upward in the direction of arrow "B" so that the OD of the first substrate $24_1$ is engaged with the walls 66, 68 of the first recess $62_1$ and the first substrate $24_1$ is disengaged with the associated dividers 18a, b of the cassette 10 (FIG. 9B). To complete the first pick and begin the second pick, the lifter again moves horizontally in the direction of arrow "A" until a second recess $62_2$ is aligned below a second substrate $24_2$. (FIG. 9C). Te lifter is again moved upward in the direction of arrow "B" so that the OD of the second substrate $24_2$ is engaged with the walls 66, 68 of the second recess $62_2$ and the second substrate $24_2$ is disengaged with the associated dividers 18a, b of the cassette 10 (FIG. 9D). The lifter again moves horizontally to completely remove the second substrate from the cassette 10 and to align yet another recess 62 with the next substrate 24 in the cassette. The lifter 50 continues with this incremental horizontal "A" and vertical "B" movement until all of the substrates 24 of a cassette 10 are "picked" or until all of the recesses 62 of the lifter 50 are full. It will be appreciated that the reverse movements can also be employed to fill a cassette with substrates using the disclosed lifter 50.

By unloading substrates from the bottom of the cassette to the top of the cassette (and loading from the top to the bottom of the cassette), the lifter 50 need not be configured to fit between adjacent disks allowing for greater thickness of the device.

The lifter 50 and its components can be constructed from any of a variety of materials, including metals, polymers and combinations thereof. In some embodiments, a non-marring material rated to the flammability standards of UL 94-V0 may be used. In one exemplary embodiment, the lifter 50 may be constructed of polyetheretherketone (PEEK). In addition, where relatively flexible polymers are used, the lifter 50 may include a layer of dampening material to prevent undesirable vibration that could cause the substrates 24 to be dislodged from the lifter during carriage. In one embodiment, the layer of dampening material is a unidirectional carbon fiber mat, in which the fibers are generally aligned with the length of the lifter 50.

Figure 10:
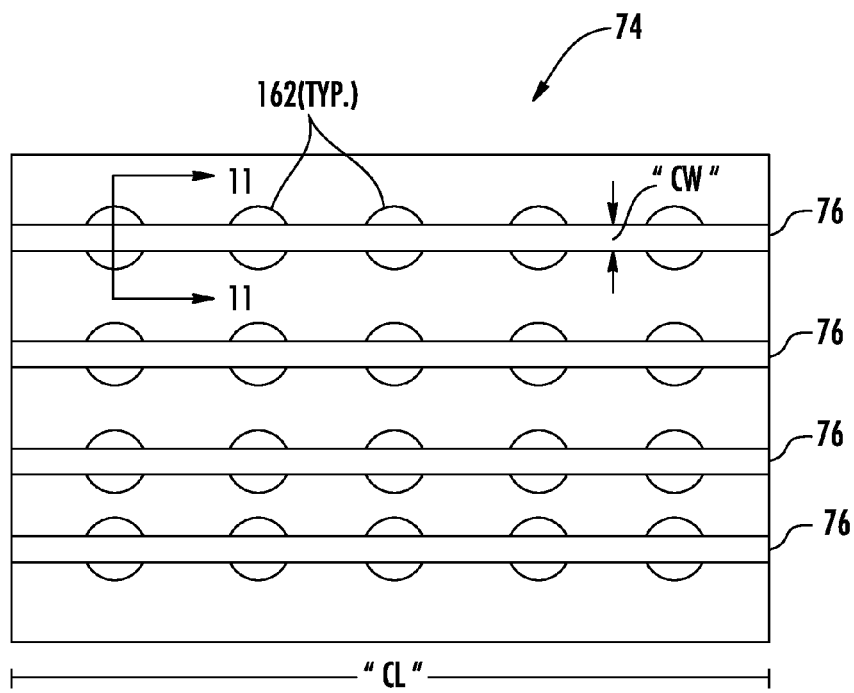
FIG. 10 is a plan view of an exemplary substrate carrier for receiving a substrate from the disclosed lifter.
Figure 11:
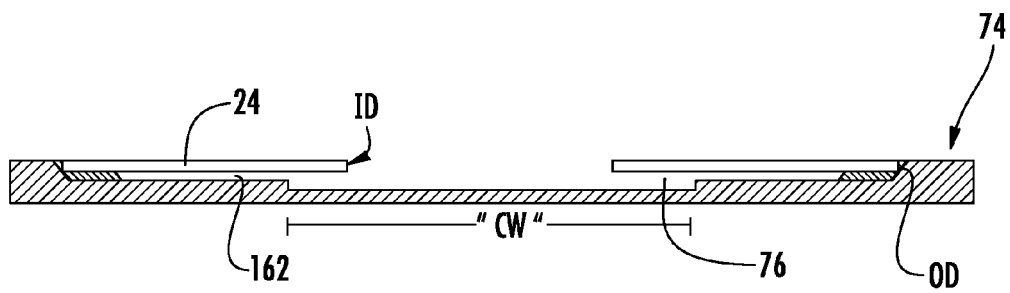
FIG. 11 is a cross-section view of the substrate carrier of FIG. 10, taken alone line 11-11 of FIG. 10.

Once the substrates 24 have been removed from the cassette 10 and loaded onto the lifter 50, they may be transferred to a carrier, such as the previously described FOUP 31, so that they may then undergo one or more processing steps using a system such as that described in relation to FIG. 2. Similar to cassette 10, FOUP 31 may contain a plurality of substrates 24, where one or more substrates 24 are held in a carrier within the FOUP. FIGS. 10 and 11 show an exemplary carrier 74 used to hold a plurality of substrates 24. The carrier 74 may include a plurality of recesses 162 oriented in rows corresponding in number and position to the recesses 62 of the lifter 50. The illustrated carrier 74 includes four rows of five recesses each, which may be used with a lifter 50 having five recesses 62. As can be seen in FIG. 11, the recesses 162 may have geometries (angled walls, etc.) that are the same as those described in relation to the recesses 62 of the lifter 50. The carrier may include slots 76 that run the length "CL" of the carrier 74 and that have a width "CW" that is slightly greater than the width "W" (FIG. 3) of the lifter 50. This arrangement enables the lifter 50, loaded with substrates 24, to be moved into position above the carrier 74 so that the substrates 24 on the lifter 50 align with the recesses 162 of the carrier in a single row. The lifter 50 is then moved downward until all of the substrates 24 are received in the respective carrier recesses 162. The lifter continues downward into the respective slot 76, and is removed once the substrates 24 are engaged with the carrier recesses 162, completing the transfer of the substrates to the carrier. When a desired number of substrates is loaded into the carrier 74, the carrier may be loaded into a FOUP. Further processing of the substrates 24 may then be commenced.

Figure 12:
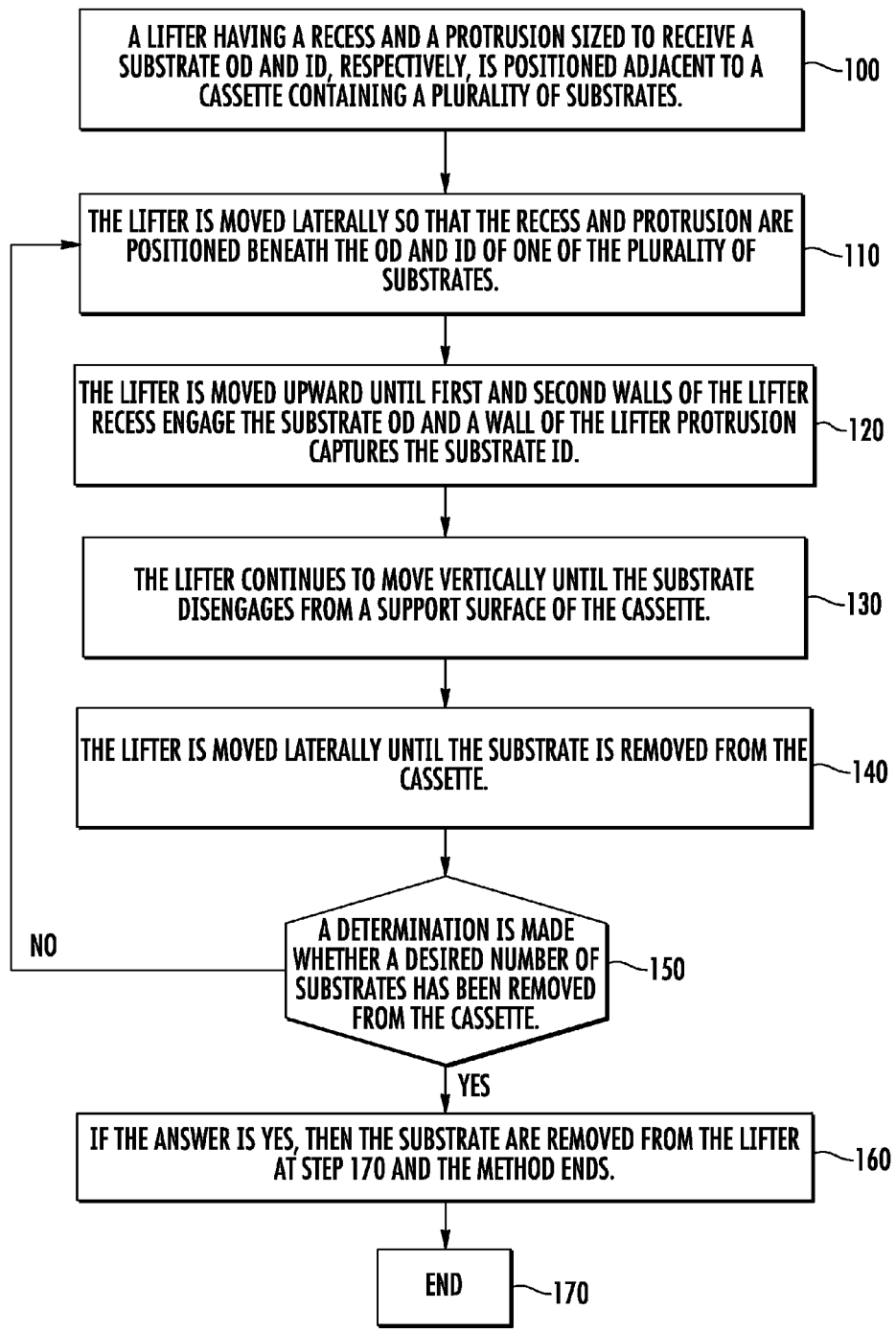
FIG. 12 is an exemplary logic flow according to one embodiment of the disclosed method.

An exemplary logic flow will now be described in relation to FIG. 12. At step 100, a lifter 50 having a recess and a protrusion sized to receive a substrate OD and ID, respectively, is positioned adjacent to a cassette 10 having a plurality of horizontally oriented substrates 24. At step 110 the lifter is moved laterally so that the lifter recess 62 and protrusion 64 are positioned beneath the OD and ID of one of the plurality of substrates. At step 120, the lifter is moved upward so that first and second walls of the lifter recess engage the substrate OD, and a wall of the lifter protrusion captures the substrate ID. At step 130, the lifter continues to move vertically until the substrate disengages from a support surface of the cassette 10. At step 140, the lifter is moved laterally until the substrate is removed from the cassette. At step 150 a determination is made whether a desired number of substrates has been removed from the cassette 10. If the answer is yes, then the substrates are removed from the lifter at step 160 and the method ends. If the answer is no, then the method returns to step 110.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate lifter for removing a horizontally oriented substrate having an inside diameter (ID) and an outside diameter (OD) from a substrate cassette, the substrate lifter comprising:
    an engagement end for engaging the substrate and an adjustment end for engaging an adjustment assembly;
    the engagement end comprising:
        a recess having first and second arcuate sidewalls configured to engage the OD of the substrate, each of the first and second arcuate sidewalls having an angled side surface, and
        a circular protrusion having an angled protrusion sidewall positioned between the first and second arcuate sidewalls, the circular protrusion configured to at least partially extend into a circular opening of the substrate defined by the ID of the substrate,
    wherein the engagement end is configured to engage the substrate in a first position in which the OD of the substrate engages the first and second arcuate sidewalls and the ID of the substrate is offset from the angled protrusion sidewall by a gap; and
    wherein the engagement end is further configured to engage the substrate in a second position in which the OD of the substrate engages the first and second arcuate sidewalls, and a portion of the ID of the substrate engages the protrusion sidewall.

2. The substrate lifter of claim 1, the angled side surfaces of the first and second arcuate sidewalls each forming a first angle with an upper surface of the lifter such that a radius of the first and second sidewalls is greater adjacent to the upper surface of the lifter than a radius of the first and second arcuate sidewalls adjacent to a bottom surface of the recess.

3. The substrate lifter of claim 2, wherein a radius of the angled protrusion sidewall adjacent to the upper surface of the lifter is less than a radius of the protrusion sidewall adjacent to the bottom surface of the recess.

4. The substrate lifter of claim 3, the angled protrusion sidewall forming a second angle with respect to the upper surface of the lifter, the first and second angles being different.

5. The substrate lifter of claim 4, the first angle being greater than the second angle.

6. The substrate lifter of claim 4, the angled protrusion sidewall configured to prevent a face of the substrate from contacting the lifter.

7. The substrate lifter of claim 1, the first and second arcuate sidewalls configured to provide a gap between a face of the substrate and a bottom surface of the recess.

8. The substrate lifter of claim 7, wherein the gap is about 1 millimeter.

9. The substrate lifter of claim 1, comprising a plurality of recesses configured to receive a plurality of substrates, each of said recesses having first and second arcuate sidewalls configured to engage an OD of the associated substrate, and a circular protrusion positioned between the first and second arcuate sidewalls, the circular protrusion configured to at least partially extend into a circular opening of the associated substrate defined by an ID of the associated substrate, the circular protrusion further configured to allow lateral movement of the associated substrate up to a predetermined amount to prevent lateral movement of the associated substrate in excess of the predetermined amount.

10. The substrate lifter of claim 1, wherein the lifter has a width defined between first and second side surfaces, the width being smaller than the OD of the substrate.

11. A substrate lifter for removing a horizontally oriented substrate from a substrate cassette, the substrate lifter comprising:
    an engagement end for engaging the substrate and an adjustment end for engaging an adjustment assembly;
    the engagement end comprising a recess having first and second arcuate sidewalls for engaging an OD of the substrate, the first and second arcuate sidewalls forming a first angle with an upper surface of the lifter such that a radius of the first and second sidewalls is greater adjacent to the upper surface of the lifter than a radius of the first and second sidewalls adjacent to a bottom surface of the recess; and
    a circular protrusion having an angled protrusion sidewall between the first and second arcuate sidewalls, the circular protrusion configured to at least partially extend into a circular opening of the substrate defined by the ID of the substrate, the circular protrusion further configured to allow lateral movement of the substrate up to a predetermined amount;

wherein the engagement end is configured to engage the substrate in a first position in which the OD of the substrate engages the first and second arcuate sidewalls and the ID of the substrate is offset from the angled protrusion wall by a gap, and in a second position in which the OD of the substrate engages the first and second arcuate sidewalls and a portion of the ID of the substrate engages the angled protrusion sidewall.

12. The substrate lifter of claim 11, wherein a radius of the angled protrusion side wall adjacent to the upper surface of the lifter is less than a radius of the angled protrusion sidewall adjacent to the bottom surface of the first and second recesses.

13. The substrate lifter of claim 12, the angled protrusion sidewall forming a second angle with respect to the upper surface of the lifter, the first and second angles being different.

14. The substrate lifter of claim 13, the first angle being greater than the second angle.

15. The substrate lifter of claim 14, the angled protrusion sidewall configured to prevent a face of the substrate from contacting the lifter.

16. The substrate lifter of claim 11, the first and second arcuate sidewalls configured to provide a gap between a face of the substrate and a bottom surface of the recess.

17. The substrate lifter of claim 16, wherein the gap is about 1 millimeter.

* * * * *